(12) United States Patent
Maida et al.

(10) Patent No.: US 7,849,711 B2
(45) Date of Patent: Dec. 14, 2010

(54) TITANIA-DOPED QUARTZ GLASS AND MAKING METHOD, EUV LITHOGRAPHIC MEMBER AND PHOTOMASK SUBSTRATE

(75) Inventors: Shigeru Maida, Joetsu (JP); Motoyuki Yamada, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/512,436

(22) Filed: Jul. 30, 2009

(65) Prior Publication Data

US 2009/0288448 A1 Nov. 26, 2009

Related U.S. Application Data

(62) Division of application No. 11/634,270, filed on Dec. 6, 2006, now Pat. No. 7,585,598.

(30) Foreign Application Priority Data

Dec. 8, 2005 (JP) ............................. 2005-354488
Nov. 27, 2006 (JP) ............................. 2006-318172

(51) Int. Cl.
  *G03F 1/00* (2006.01)
  *C03B 19/06* (2006.01)
(52) U.S. Cl. ........................................... 65/17.4; 430/5
(58) Field of Classification Search ................ 430/5; 65/17.2, 17.4, 421
See application file for complete search history.

(56) References Cited

U.S. PATENT DOCUMENTS 6,479,195 B1 11/2002 Kirchauer et al.

| 2002/0043080 | A1 | 4/2002 | Best et al. |
| 2003/0226377 | A1 | 12/2003 | Barrett et al. |
| 2004/0045318 | A1 | 3/2004 | Hrdina et al. |
| 2005/0245383 | A1 | 11/2005 | Iwahashi et al. |
| 2008/0274869 | A1 | 11/2008 | Englisch et al. |

FOREIGN PATENT DOCUMENTS

| EP | 1063203 A1 | 6/2000 |
| JP | 9-59034 A | 3/1997 |
| WO | 97/10182 A1 | 3/1997 |
| WO | 03/077038 A2 | 9/2003 |
| WO | 2004/089838 A1 | 10/2004 |
| WO | 2005/114328 A2 | 12/2005 |

OTHER PUBLICATIONS

V. S. Khotimchenko et al.; "Determining the Content of Hydrogen Dissolved in Quartz Glass Using the Methods of Raman Scattering and Mass Spectrometry", Zurnal Priladnoi Spectroskopii, vol. 46, No. 6, pp. 987-991, Jun. 1987.
European Search Report dated Apr. 16, 2007, issued in corresponding European Patent Application No. 06256239.

*Primary Examiner*—Stephen Rosasco
(74) *Attorney, Agent, or Firm*—Westerman, Hattori, Daniels & Adrian, LLP

(57) ABSTRACT

A titania-doped quartz glass containing 3-12 wt % of titania at a titania concentration gradient less than or equal to 0.01 wt %/$\mu$m and having an apparent transmittance to 440 nm wavelength light of at least 30% at a thickness of 6.35 mm is of such homogeneity that it provides a high surface accuracy as required for EUV lithographic members, typically EUV lithographic photomask substrates.

2 Claims, 1 Drawing Sheet

TITANIA-DOPED QUARTZ GLASS AND MAKING METHOD, EUV LITHOGRAPHIC MEMBER AND PHOTOMASK SUBSTRATE

CROSS-REFERENCE TO RELATED APPLICATION

This non-provisional application claims priority under 35 U.S.C. §119(a) on Patent Application Nos. 2005-354488 and 2006-318172 filed in Japan on Dec. 8, 2005 and Nov. 27, 2006, respectively, and on patent application Ser. No. 11/634,270 filed in the United States on Dec. 6, 2006, the entire contents of which are hereby incorporated by reference.

TECHNICAL FIELD

This invention relates to titania-doped quartz glass of high homogeneity, EUV lithographic members, typically photomask substrates, formed therefrom to a high surface accuracy, and a method for preparing the titania-doped quartz glass.

BACKGROUND ART

As is well known, the recent semiconductor integrated circuitry technology is in rapid progress toward higher integration. In accordance with this propensity, the exposure light source used in the lithography process for semiconductor device manufacture is progressively reduced in wavelength. Nowadays, the lithography using an ArF excimer laser (193 nm) almost becomes the mainstream. To achieve further integration in the future, it is considered promising for the lithography to make a transition to $F_2$ excimer laser (157 nm) or extreme ultraviolet (EUV). Since the $F_2$ excimer laser lithography is now found to leave a number of technical problems to be solved, the transition to EUV lithography is deemed likely.

The EUV lithography is expected to use soft x-ray, especially a wavelength near 13 nm as the light source. Since there are available no materials having a high transmittance at such wavelength, a catoptric system is employed in the EUV lithography. In the system, reflection is assigned to a reflective multilayer film of silicon, molybdenum or the like deposited on a substrate, and several tens of percents of incident EUV light is not reflected, but reaches the substrate where it is converted into heat. In the EUV lithography using a light source of an extremely short wavelength as compared with the conventional lithography, even slight thermal expansion due to the heat that has reached substrates and other members in the lithographic optical system can adversely affect the lithography accuracy. Therefore, members including reflecting mirrors, masks and stages must be formed of low expansion materials. Also in the EUV lithography using a light source of a short wavelength, even slight irregularities on the member surface can adversely affect the lithography accuracy. Therefore, the surface topography or contour needs a high accuracy.

One of well-known low expansion materials is titania-doped quartz glass. Quartz glass can be reduced in thermal expansion by adding a certain amount of titania. However, prior art titania-doped quartz glass contains regions which are heterogeneous in structure and composition. Structurally and compositionally heterogeneous regions of one type are striae. In the case of titania-doped quartz glass, it is believed that striae are caused by changes of dopant titania amount. If titania-doped quartz glass containing strong striae is machined and polished into any member for use in the EUV lithography, the resulting member develops irregularities on its surface. It has not become possible to use prior-art titania-doped quartz glass as EUV lithographic members which must have a surface topography of the high accuracy required.

One known means for overcoming irregularities caused by striae is by polishing an EUV lithographic member and then selectively grinding off raised portions on the member surface using ion beam or the like. This means considerably increases the manufacture cost of members.

WO 03/76352 discloses a method of avoiding striae involving powdering titania-doped quartz glass containing striae and re-solidifying by Verneuil's method. With this method, there still remains a problem that granular structure or the like tends to generate irregularities on the member surface after polishing.

JP-A 2004-131373 discloses the preparation of titania-doped quartz glass by the sol-gel method. In general, the sol-gel method has problems such as difficulty to produce large-size ingots and crack susceptibility.

WO 02/32622 discloses a method of fusing a thin plate of titania-doped quartz glass without surface-exposed striae to a member with surface-exposed striae for thereby avoiding irregularities due to striae on the member surface. When titania-doped quartz glass is prepared by the so-called direct or indirect method of subjecting a silicon source gas and a titanium source gas to hydrolysis by oxyhydrogen flame, striae are often generated at intervals of less than several hundreds of microns and the striae are curved rather than flat. It is thus difficult to obtain titania-doped quartz glass without surface-exposed striae, leaving a problem from the productivity aspect as well. Even if a thin plate of titania-doped quartz glass without surface-exposed striae is used, the fusion of the thin plate must be followed by polishing, with an increased possibility that striae be exposed on the polished surface.

JP-A 2004-315351 discloses that EUV lithographic members having a high surface accuracy are obtainable from titania-doped quartz glass having a $TiO_2$ concentration variation ($\Delta TiO_2$) less than or equal to 0.06% by weight. However, controlling only $\Delta TiO_2$ does not always succeed in producing EUV lithographic members having a surface topography with the required high accuracy.

DISCLOSURE OF THE INVENTION

An object of the invention is to provide a titania-doped quartz glass of high homogeneity capable of providing a high surface accuracy as required for EUV lithographic members, typically EUV lithographic photomask substrates; EUV lithographic members, typically EUV lithographic photomask substrates, formed from the titania-doped quartz glass; and a method for preparing the titania-doped quartz glass.

The inventor has found that a titania-doped quartz glass containing 3 to 12% by weight of titania at a titania concentration gradient less than or equal to 0.01% by weight per micron and having an apparent transmittance to 440-nm wavelength light of at least 30% at a thickness of 6.35 mm has a high homogeneity enough to achieve a high surface accuracy as required for EUV lithographic members, typically EUV lithographic photomask substrates. The invention also relates to a method for preparing titania-doped quartz glass by subjecting a silicon source gas and a titanium source gas to flame hydrolysis with the aid of a combustible gas and a combustion-supporting gas in a furnace, to thereby form synthetic silica fine particles, depositing the silica fine particles on a rotating target, and concurrently melting and vitrifying the deposited silica into titania-doped quartz glass. The inventor has found that the titania-doped quartz glass meeting the above requirements can be prepared when the target is rotated at a speed of at least 5 rpm, the flow rates of the silicon source gas, the titanium source gas, the combustible gas and the combustion-supporting gas are controlled to a variation within ±1%/hr, and the temperatures of the gases fed into or taken out of the furnace and the ambient atmosphere around the furnace are controlled to a variation within ±2.5° C.

Accordingly, the present invention provides a titania-doped quartz glass, EUV lithography member, EUV lithography photomask substrate, and method for preparing the titania-doped quartz glass, as defined below.

In a first aspect, the invention provides a titania-doped quartz glass containing 3 to 12% by weight of titania at a titania concentration gradient less than or equal to 0.01 wt %/μm and having an apparent transmittance to 440-nm wavelength light of at least 30% at a thickness of 6.35 mm. In preferred embodiments, the titania-doped quartz glass has a birefringence less than or equal to 20 nm/cm, an average coefficient of linear thermal expansion (sometimes abbreviated as CTE) of −30 to +30 ppb/° C. in the temperature range between 10° C. and 30° C., an OH group concentration distribution less than or equal to 400 ppm, a hydrogen molecule concentration less than or equal to $5 \times 10^{18}$ molecules/cm$^3$, a Si—H bond content less than or equal to $5 \times 10^{17}$ bonds/cm$^3$, and/or a chlorine concentration of 1 to 500 ppm. Also preferably, the titania-doped quartz glass does not turn crystalline on annealing at 700° C.

In a second aspect, the invention provides an EUV lithographic member comprising the titania-doped quartz glass defined above. Typically the member is an EUV lithographic photomask substrate.

In a third aspect, the invention provides an EUV lithographic photomask substrate, as defined above, which is a rectangular substrate defining a square surface of 152.4 mm×152.4 mm, the substrate having a surface roughness (rms) less than or equal to 0.2 nm over a central square region of 142.4 mm×142.4 mm within the substrate surface. In a preferred embodiment, the EUV lithographic photomask substrate is a rectangular substrate defining a square surface of 152.4 mm×152.4 mm, the substrate having a difference less than or equal to 100 nm between the highest and the lowest points in a central square region of 142.4 mm×142.4 mm within the substrate surface. In another preferred embodiment, the EUV lithographic photomask substrate is a rectangular substrate defining a square surface of 152.4 mm×152.4 mm, the substrate having a difference less than or equal to 20 nm between the highest and the lowest points in every area of 1 mm$^2$ in a central square region of 142.4 mm×142.4 mm within the substrate surface.

In a fourth aspect, the invention provides a method for preparing a titania-doped quartz glass, comprising the steps of subjecting a silicon source gas and a titanium source gas to flame hydrolysis with the aid of a combustible gas and a combustion-supporting gas in a furnace, to thereby form synthetic silica fine particles, depositing the silica fine particles on a rotating target, and concurrently melting and vitrifying the deposited silica into titania-doped quartz glass. According to the invention, the target is rotated at a speed of at least 5 rpm, the flow rates of the silicon source gas, the titanium source gas, the combustible gas and the combustion-supporting gas are controlled to a variation within ±1%/hr, and the temperatures of the gases fed into or taken out of the furnace and the ambient atmosphere surrounding the furnace are controlled to a variation within ±2.5° C. The method may further comprise the step of annealing the titania-doped quartz glass by holding at 700 to 1300° C. in air for 1 to 200 hours and then slowly cooling at a rate of 1 to 20° C./hr to 500° C.

BENEFITS OF THE INVENTION

The titania-doped quartz glass of the invention has a high homogeneity enough to achieve a high surface accuracy as required for EUV lithographic members, typically EUV lithographic photomask substrates. The EUV lithographic members, typically EUV lithographic photomask substrates, formed from the titania-doped quartz glass are improved in flatness and thermal expansion.

BRIEF DESCRIPTION OF THE DRAWINGS

The only FIGURE.

DESCRIPTION OF THE PREFERRED EMBODIMENT

Figure 1:
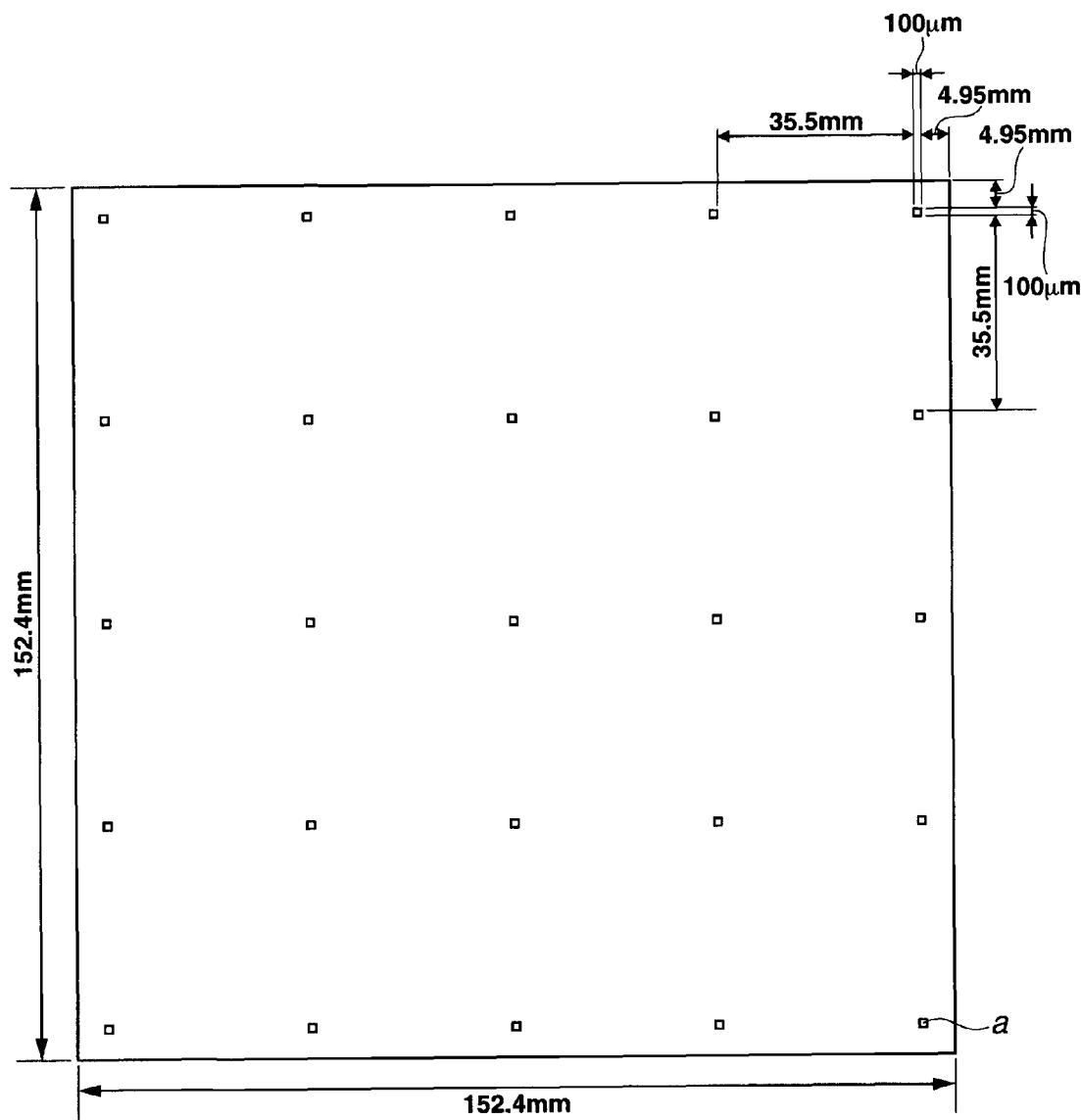
FIG. 1 is a plan view showing measurement spots on a substrate surface where surface roughness is measured in Example and Comparative Example.

The titania-doped quartz glass of the invention should contain 3 to 12% by weight of titania, have a titania concentration gradient less than or equal to 0.01% by weight per micron, and have an apparent transmittance to 440-nm wavelength light of at least 30% at a thickness of 6.35 mm. The titania-doped quartz glass with these characteristics is suited as a member for use in an optical system using ultraviolet radiation, especially extreme ultraviolet (EUV) radiation with wavelength less than or equal to 70 nm as a light source.

A differential concentration of titania within titania-doped quartz glass induces structural and compositional changes to the titania-doped quartz glass, which in turn, induce changes of physical and chemical properties. Physical and chemical properties include the hardness of titania-doped quartz glass and the reactivity with a polishing compound. Both have an impact on a polishing rate, eventually generating irregularities on the surface of titania-doped quartz glass as polished. The surface irregularities on the titania-doped quartz glass as polished, however, are not only dictated by the differential concentration of titania, but are also largely dependent on the concentration gradient of titania.

When two regions have the same difference in titania concentration between two points in quartz glass, but are different in the distance between two points, polishing of these two regions including two points spaced apart at different distances results in surface regions with different irregularities. It has not been clearly understood why irregularities on the substrate surface as polished are affected by the concentration gradient of titania. One reason is, for example, that a region with a higher concentration gradient of titania contains within quartz glass more strains, which are released during polishing, resulting in a difference in polishing rate relative to a region with a lower concentration gradient of titania.

Accordingly, the titania-doped quartz glass of the invention should contain 3 to 12% by weight, preferably 5 to 9% by weight of titania, and have a titania concentration gradient less than or equal to 0.01 wt %/μm, preferably up to 0.005 wt %/μm, more preferably 0.001 wt %/μm. As used herein, the "titania concentration gradient" is a concentration difference between arbitrary two points within titania-doped quartz glass, divided by the distance between the two points, and the concentration gradient falls within the range throughout the titania-doped quartz glass. An EUV lithographic member, typically EUV lithographic photomask substrate, formed from such titania-doped quartz glass has the same titania concentration and concentration gradient.

It is noted that since the titania concentration of titania-doped quartz glass is in proportion to the refractive index, a minute variation of titania concentration in titania-doped quartz glass can be evaluated by measuring a distribution of refractive index. The titania concentration gradient can be evaluated therefrom. The relationship of the refractive index (n) at 632.8 nm to the titania concentration (x in % by weight) of titania-doped quartz glass is represented by the equation (1).

$$n=3.28\times10^{-3}\times x+1.4586 \quad (1)$$

Therefore, the relationship of refractive index difference (Δn) to titania concentration difference (Δx in % by weight) is represented by the equation (2).

$$\Delta n=3.28\times10^{-3}\times\Delta x \quad (2)$$

Sometimes titania-doped quartz glass becomes brown in color because some titanium elements with a valence of +3 are present in quartz glass. Titania-doped quartz glass exhibits different coefficients of linear thermal expansion between a region with more +3 valent titanium and a region with less +3 valent titanium, provided that the total amount of titanium in each region is the same. For this reason, the titania-doped quartz glass of the invention should have an apparent transmittance at a wavelength of 440 nm and a thickness of 6.35 mm of at least 30%, preferably at least 60%, and more preferably at least 80% so that an EUV lithographic member, typically EUV lithographic photomask substrate, featuring uniformity of coefficient of linear thermal expansion may be formed therefrom.

The amount of +3 valent titanium in titania-doped quartz glass can be determined simply by measuring the apparent transmittance thereof because +3 valent titanium has absorption near 440 nm. As used herein, the term "apparent transmittance" refers to an actual measurement of transmittance of a polished material by a transmittance meter. The apparent transmittance at 440 nm can be measured by a spectrophotometer Cary 400 by Varian, Inc.

When a titania-doped quartz glass according to the invention is machined, sliced, mirror polished on surfaces, and cleaned, for example, there is obtained an EUV lithographic photomask substrate defining a square surface of 152.4 mm×152.4 mm (6"×6") and having a thickness of 6.35 mm, which has an apparent transmittance to 440-nm wavelength light of at least 30%, preferably at least 60%, and more preferably at least 80%.

In titania-doped quartz glass, strain is introduced not only by a titania concentration gradient, but also by other factors including a variation of growth surface temperature during preparation of titania-doped quartz glass, and variations in silicon source gas and titanium source gas, and also when titania-doped quartz glass is hot molded or machined into a shape suitable as EUV lithographic members.

In general, strain is measurable as a retardation (or optical-path difference) caused by birefringence. The titania-doped quartz glass should preferably have a birefringence less than or equal to 20 nm/cm, more preferably less than or equal to 10 nm/cm, and even more preferably less than or equal to 5 nm/cm. Like the concentration gradient, the strain can cause a difference in polishing rate, eventually forming irregularities on the titania-doped quartz glass surface as polished. In this sense, titania-doped quartz glass having a birefringence in excess of 20 nm/cm is, in some cases, inadequate for EUV lithographic members such as EUV lithographic photomask substrates. It is noted that birefringence is measurable by a heterodyne birefringence meter of Uniopt Ltd. An EUV lithographic member, typically EUV lithographic photomask substrate, formed from such titania-doped quartz glass has the same birefringence.

The titania-doped quartz glass preferably has an average coefficient of linear thermal expansion of −30 to +30 ppb/° C. at a room temperature level of 10 to 30° C. The room temperature level refers to a temperature range corresponding to the operative temperature of the EUV lithography. If the average coefficient of linear thermal expansion is outside the range, titania-doped quartz glass is, in some cases, inadequate for EUV lithographic members, typically EUV lithographic photomask substrates. It is noted that an average coefficient of linear thermal expansion can be determined on a cylindrical specimen with a diameter of 3.5 mm and a height of 25 mm using a precision thermal expansion meter of NETZSCH. An EUV lithographic member, typically EUV lithographic photomask substrate, formed from such titania-doped quartz glass has the same average coefficient of linear thermal expansion.

An OH group concentration of titania-doped quartz glass may have an impact on the thermal expansion thereof. This is because OH groups cause scissions to the bond network between oxygen and silicon or titanium. According to our finding, the average coefficient of linear thermal expansion at 10 to 30° C. increases by about 9 to 13 ppb/° C. as the OH group concentration in titania-doped quartz glass increases by 100 ppm.

Then the titania-doped quartz glass preferably has an OH group concentration distribution less than or equal to 400 ppm, more preferably less than or equal to 200 ppm, and even more preferably less than or equal to 50 ppm. As used herein, the term "OH group concentration distribution" refers to a difference between maximum and minimum concentrations when an OH group concentration is measured throughout the titania-doped quartz glass. If the OH group concentration distribution exceeds 400 ppm, there is a possibility that the average coefficient of linear thermal expansion at 10 to 30° C. falls outside the range of −30 to +30 ppb/° C. It is noted that the OH group concentration can be measured by an infrared spectrophotometer. Specifically, it can be determined from an absorption coefficient at wave number 4522 cm$^{-1}$ as measured by a Fourier transform infrared spectrometer, in accordance with the conversion formula:

$$\text{OH group concentration (ppm)}=\alpha/T\times4400$$

wherein α is an absorption coefficient at 4522 cm$^{-1}$ and T is a thickness (cm) of a test sample.

In the EUV lithography, the EUV light that has reached a substrate without being reflected by a reflective multilayer film of silicon, molybdenum or the like deposited on the substrate is not only converted into heat, but also can sometimes induce semi-permanent changes to the substrate material. Particularly in the case of titania-doped quartz glass, if the glass contains large amounts of hydrogen molecules and Si—H bonds, the EUV light can cause to change the valence of titanium element in the titania-doped quartz glass or the structure of the titania-doped quartz glass, thus exercising an impact on the coefficient of thermal expansion.

The titania-doped quartz glass should preferably have a hydrogen molecule concentration less than or equal to $5\times10^{18}$ molecules per cubic centimeters, more preferably less than or equal to $1\times10^{18}$ molecules/cm$^3$, and even more preferably less than or equal to $5\times10^{17}$ molecules/cm$^3$. It is noted that a hydrogen molecule concentration can be measured according to Raman spectroscopy, for example, by the method described in Zurnal Priladnoi Spectroskopii, Vol. 46, No. 6, pp 987-991, June 1987.

The titania-doped quartz glass should preferably have a Si—H bond content less than or equal to $5\times10^{17}$ bonds per cubic centimeters, more preferably less than or equal to $1\times10^{17}$ bonds/cm$^3$, and even more preferably less than or equal to $5\times10^{16}$ bonds/cm$^3$. It is noted that a Si—H bond content can be measured according to Raman spectroscopy, for example, by the method described in JP-A 09-059034.

The titania-doped quartz glass should preferably have a chlorine concentration of 1 to 500 ppm, more preferably 1 to 200 ppm, and even more preferably 10 to 100 ppm. While EUV lithographic members are required to have a high surface accuracy, conventional polishing methods alone are sometimes difficult to achieve the desired surface accuracy. One effective means of modifying the surface accuracy in such cases is selective machining by irradiating a plasma to raised portions on the surface of an EUV lithographic member as polished. The plasma-assisted machining process, however, is a time consuming operation and uses gases which are expensive. It is thus earnestly desired to reduce the processing time. The presence of chlorine in titania-doped quartz glass permits to increase a rate of plasma machining, thus reducing the cost of plasma treatment.

The titania-doped quartz glass may contain elements other than silicon, titanium, oxygen, hydrogen and chlorine, as long as the contents of other elements are individually less than or equal to 1,000 ppm. Although the inclusion of elements other than silicon, titanium, oxygen, hydrogen and chlorine may cause the titania-doped quartz glass to have a little change of average coefficient of linear thermal expansion in the temperature range of 10 to 30° C., the average coefficient of linear thermal expansion can be controlled to −30 to +30 ppb/° C. by adjusting the amount of titania dopant.

The titania-doped quartz glass of the invention is a suitable feedstock for EUV lithographic members, typically EUV lithographic photomask substrates. In particular, EUV lithographic photomask substrates are required to have a surface roughness of high accuracy in order to enable the transfer of a fine pattern of high image quality onto a wafer. From the titania-doped quartz glass of the invention, EUV lithographic photomask substrates capable of meeting the required high accuracy can be formed.

Specifically, from the titania-doped quartz glass of the invention, photomask substrates can be formed to a surface roughness (root mean square) less than or equal to 0.2 nm, preferably less than or equal to 0.15 nm, and more preferably less than or equal to 0.1 nm, after polishing. As used herein, the surface roughness (rms) can be determined by atomic force microscopy. For a photomask substrate defining a square surface of 152.4 mm×152.4 mm, for example, preferably the surface roughness (rms) within a central square region of 142.4 mm×142.4 mm falls within the above range. If the surface roughness (rms) is outside the range, the substrate fails to meet the surface topography required for EUV lithographic photomask substrates. As used herein, the term "central region" refers to a square region which is disposed coaxial with the square substrate surface.

The EUV lithographic photomask substrate must also have an overall flatness and a local flatness with a high accuracy. In the case of an exemplary photomask substrate which is actually utilized during exposure through a square photomask of 152.4 mm×152.4 mm by EUV lithography, a high accuracy is required for both the flatness of a region within the substrate surface, specifically a central square region of 142.4 mm×142.4 mm within the substrate surface, and the flatness in every area of 1 mm$^2$ in the same central square region of 142.4 mm×142.4 mm. From the titania-doped quartz glass of the invention, an EUV lithographic photomask substrate meeting the required high accuracy can be formed.

Specifically, from the titania-doped quartz glass of the invention, an EUV lithographic photomask substrate can be formed having a difference between the highest and the lowest points (i.e., peak and valley) in a central square region of 142.4 mm×142.4 mm within the substrate surface as polished, also referred to as PV flatness, less than or equal to 100 nm, preferably less than or equal to 50 nm, and more preferably less than or equal to 20 nm. Also, an EUV lithographic photomask substrate can be formed having a difference between the highest and the lowest points in every area of 1 mm$^2$ in a central square region of 142.4 mm×142.4 mm within the substrate surface as polished, also referred to as PV flatness, less than or equal to 20 nm, preferably less than or equal to 10 nm, and more preferably less than or equal to 5 nm. It is noted that these PV flatnesses can be evaluated by using a laser interferometer and determining a difference between the highest and the lowest points in a central square region of 142.4 mm×142.4 mm within the substrate surface or a difference between the highest and the lowest points in every area of 1 mm$^2$ in a central square region of 142.4 mm×142.4 mm within the substrate surface. If the PV flatnesses are outside the respective ranges, the substrate fails to meet the surface topography required for EUV lithographic photomask substrates.

A substrate having a surface roughness, a flatness, and a difference between the highest and the lowest points within the above-defined ranges can be manufactured by mirror polishing in a conventional manner a titania-doped quartz glass containing 3 to 12% by weight of titania at a titania concentration gradient less than or equal to 0.01 wt %/µm and having an apparent transmittance to 440-nm wavelength light of at least 30% at a thickness of 6.35 mm, and especially a titania-doped quartz glass having a birefringence less than or equal to 20 nm/cm in addition to the foregoing characteristics, as prepared by the method to be described below.

Such a titania-doped quartz glass is prepared by feeding a combustible gas containing hydrogen gas and a combustion-supporting gas containing oxygen gas to a burner in a quartz glass production furnace for combustion to form an oxyhydrogen flame at the burner tip, feeding a silicon source gas and a titanium source gas to the oxyhydrogen flame for subjecting them to flame hydrolysis to thereby form fine particles of silicon oxide, titanium oxide and composites thereof, depositing the fine particles on a target which is disposed forward of the burner tip, and concurrently melting and vitrifying the deposit into quartz glass, growing to form an ingot, hot molding the ingot into a desired shape, annealing the shaped ingot, and slowly cooling. In the method of preparing titania-doped quartz glass according to the invention, the flow rates of the silicon source gas, the titanium source gas, the combustible gas and the combustion-supporting gas are controlled to a variation within ±1%/hr; the temperatures of air introduced to flow through the furnace, the gases discharged out of the furnace and the ambient atmosphere surrounding the furnace are controlled to a variation within ±2.5° C.; and the target is rotated at a speed of at least 5 rpm while the fine particles are being deposited on the target.

The titania-doped quartz glass production furnace used herein may be either vertical or lateral type. The rotational speed of the target including a seed or the like should be greater than or equal to 5 rpm, preferably greater than or equal to 15 rpm, and more preferably greater than or equal to 30 rpm. The reason is as follows. Structurally and/or compositionally heterogeneous regions such as striae and strain are generated in titania-doped quartz glass largely depending on the unevenness of temperature of a titania-doped quartz glass-growing surface on the rotating target. Then, the rotational speed of the target is increased such that the temperature of a titania-doped quartz glass-growing surface becomes even, thereby preventing the titania-doped quartz glass from generating structurally and/or compositionally heterogeneous regions.

The generation of structurally and/or compositionally heterogeneous regions in titania-doped quartz glass can also be alleviated by steady supplies of the silicon source gas, the titanium source gas, the combustible gas and the combustion-supporting gas used during preparation of titania-doped quartz glass. To this end, the inventive method feeds to the furnace the silicon source gas, the titanium source gas, the combustible gas and the combustion-supporting gas at flow rates which are controlled to a variation within ±1%/hr, preferably within ±0.5%/hr, and more preferably within ±0.25%/hr.

The generation of structurally and/or compositionally heterogeneous regions in titania-doped quartz glass can also be alleviated by stabilizing the temperatures of air introduced to flow through the furnace, the gases discharged out of the furnace, and the ambient atmosphere surrounding the furnace. To this end, the inventive method controls the temperatures of air introduced to flow through the furnace, the gases discharged out of the furnace and the ambient atmosphere surrounding the furnace to a variation within ±2.5° C., preferably within ±1° C., and more preferably within ±0.5° C.

If titania-doped quartz glass is prepared in an environment where the flow rates of the silicon source gas, the titanium source gas, the combustible gas and the combustion-supporting gas experience variations of more than ±1%/hr or the temperatures of air introduced to flow through the furnace, the gases discharged out of the furnace and the ambient atmosphere surrounding the furnace experience variations of more than ±2.5° C., then structurally and/or compositionally heterogeneous regions generate in the resulting titania-doped quartz glass. It is then difficult to prepare a titania-doped quartz glass capable of achieving a high surface accuracy as required for EUV lithographic members, typically EUV lithographic photomask substrates.

The silicon source gas used herein may comprise any well-known organosilicon compounds. Examples include chlorinated silane compounds such as silicon tetrachloride, dimethyldichlorosilane, and methyltrichlorosilane; and alkoxysilanes such as tetramethoxysilane, tetraethoxysilane, and methyltrimethoxysilane.

The titanium source gas used herein may comprise any well-known titanium compounds. Examples include titanium halides such as titanium tetrachloride and titanium tetrabromide; and titanium alkoxides such as tetraethoxytitanium, tetraisopropoxytitanium, tetra-n-propoxytitanium, tetra-n-butoxytitanium, tetra-sec-butoxytitanium, and tetra-t-butoxytitanium.

The combustible gas used herein is a hydrogen-containing gas such as hydrogen gas, optionally in combination with another gas such as carbon monoxide, methane and propane. The combustion-supporting gas used herein is an oxygen-containing gas.

An ingot of the titania-doped quartz glass of the invention having the above-described characteristics suitable as EUV lithographic members is hot molded at 1,500 to 1,800° C. for 1 to 10 hours into a shape compliant with the intended EUV lithographic member selected from mirrors, stages, and photomask substrates, annealed, and slowly cooled. The annealing and slow cooling steps are effective for alleviating the strain introduced in the titania-doped quartz glass by hot molding. The annealing step may use well-known conditions, and is typically effected by holding in air at 700 to 1300° C. for 1 to 200 hours.

It is preferred that the titania-doped quartz glass of the invention do not turn crystalline on annealing at 700° C. Crystal formation can have negative impacts including a variation of CTE, a change in outer contour of EUV lithographic member, and dusting due to scattering of crystals. As used herein, the term "crystalline" refers to cristobalite exhibiting a Raman peak near 232 and 420 $cm^{-1}$. Then whether or not crystalline matter forms can be confirmed by Raman spectroscopy of EUV lithographic members.

The slow cooling step may use well-known conditions. For example, cooling from the annealing temperature to 500° C. may occur at a rate of 1 to 20° C./hr.

In the practice of the invention, the annealing and slow cooling steps may be carried out in a heat treatment furnace having a wall made of alumina or quartz glass. To prevent formation of crystalline matter due to the introduction of impurities such as alkali or alkaline earth metals, if the furnace wall is made of alumina, the EUV lithographic member is preferably received in a quartz container before it is subjected to the annealing and slow cooling steps.

After the annealing and slow cooling steps, the titania-doped quartz glass is molded to a predetermined size by machining or slicing and then polished under well-known conditions using abrasives such as silicon oxide, aluminum oxide, molybdenum oxide, silicon carbide, diamond, cerium oxide and colloidal silica. In this way, an EUV lithographic member is obtainable.

EXAMPLE

Examples are given below for further illustrating the invention although the invention is not limited thereto.

Example 1

A titania-doped quartz glass production furnace included a quartz burner, gas feed lines connected thereto, and a rotatable target located forward of the burner. 10 $m^3$/hr of hydrogen gas and 6 $m^3$/hr of oxygen gas were fed to the burner to produce an oxyhydrogen flame while 1000 g/hr of silicon tetrachloride and 100 g/hr of titanium tetrachloride as source materials were fed to the burner. The oxyhydrogen flame-assisted hydrolysis reaction of silicon tetrachloride with titanium tetrachloride produced $SiO_2$ and $TiO_2$, which were deposited on the target which was rotated at 50 rpm and retracted at a speed of 10 mm/hr. In this way, an ingot of titania-doped quartz glass was produced. During the process, the flow rates of the feed gases were kept at a variation of ±0.2%/hr. The temperatures of air fed to the furnace, the gas discharged out of the furnace, and the ambient atmosphere around the furnace were kept at a variation of ±1° C.

The ingot thus obtained was hot molded into a square column of 155×155 mm by heating in an electric furnace at 1700° C. for 6 hours. It was annealed by holding in air at 975° C. for 150 hours, and then slowly cooled down to 500° C. at a rate of 5° C./hr. The ingot as annealed was machined into a square column of 152.4×152.4 mm, obtaining a titania-doped quartz glass ingot I. The ingot I was sliced into plates of 1 mm thick which were polished on either surface. The titania-doped quartz glass plate of 1 mm thick was measured for refractive index distribution, and a region having the maximum variation of refractive index was identified.

By using a laser interferometer with an increased magnifying power and setting the CCD coupled to the interferometer at an accuracy of about 8 μm/pixel, the refractive index distribution of the region having the maximum variation of refractive index was determined. From the refractive index distribution thus determined, an evenness of refractive index Δn was determined, and a titania concentration difference Δx (wt %) was computed therefrom according to equation (2). A titania concentration gradient (wt %/μm) was computed from the distance between the maximum and the minimum refractive index points and the titania concentration difference Δx (wt %). Table 1 summarizes the titania concentration difference Δx (wt %) and the titania concentration gradient (wt %/μm).

A titania-doped quartz glass ingot prepared by the same procedure as ingot I was measured for a titania concentration (wt %), a minimum of apparent transmittance to 440-nm wavelength light, a birefringence, maximum and minimum of average coefficient of linear thermal expansion (CTE) between 10° C. and 30° C., an OH group concentration distribution (a difference between maximum and minimum OH group concentrations), a hydrogen molecule concentration, and a Si—H bond content. The results are shown in Table 1.

Also, a titania-doped quartz glass ingot prepared by the same procedure as ingot I was sliced and mirror polished using cerium oxide as abrasives, yielding a mirror-finished substrate of 6.35 mm thick. On the substrate, twenty five measurement spots "a" are located in a central region of the substrate surface as shown in FIG. 1. A surface roughness (rms) was measured at each measurement spot "a." The maximum surface roughness (rms) among the measurements is shown in Table 1.

Next, using a laser interferometer, a difference between the highest and the lowest points in a square central region of 142.4×142.4 mm within the substrate surface, that is, a PV flatness of the exposure available region was measured. The results are shown in Table 1.

By increasing the magnifying power of the laser interferometer and setting the CCD coupled to the interferometer at an accuracy of about 8 μm/pixel, a PV flatness in every area of 1 mm² in the square central region of 142.4×142.4 mm within the substrate surface was determined. The maximum PV flatness among the measurements is shown in Table 1.

The data in Table 1 demonstrate that the titania-doped quartz glass prepared in this Example is satisfactory in titania concentration gradient, apparent transmittance at 440 nm, birefringence, CTE between 10° C. and 30° C., OH group concentration distribution (a difference between maximum and minimum OH group concentrations), hydrogen molecule concentration, and Si—H bond content. Both the PV flatness in the square central region of 142.4×142.4 mm within the substrate surface as polished and the PV flatness in every area of 1 mm² in the square central region of 142.4×142.4 mm within the substrate surface are of reduced values. The surface roughness is satisfactory. There was obtained a titania-doped quartz glass suitable for use as EUV lithographic photomask substrates.

Comparative Example 1

A titania-doped quartz glass production furnace as in Example 1 was used. 10 m³/hr of hydrogen gas and 6 m³/hr of oxygen gas were fed to the burner to produce an oxyhydrogen flame while 1000 g/hr of silicon tetrachloride and 100 g/hr of titanium tetrachloride as source materials were fed to the burner. The oxyhydrogen flame-assisted hydrolysis reaction of silicon tetrachloride with titanium tetrachloride produced $SiO_2$ and $TiO_2$, which were deposited on the target which was rotated at 3 rpm and retracted at a speed of 10 mm/hr. In this way, an ingot of titania-doped quartz glass was produced. During the process, the flow rates of the feed gases were kept at a variation of ±2%/hr. The temperatures of air fed to the furnace, the gas discharged out of the furnace, and the ambient atmosphere around the furnace were kept at a variation of ±3° C.

The ingot thus obtained was hot molded into a square column of 155×155 mm by heating in an electric furnace at 1700° C. for 6 hours. The ingot as hot molded was machined into a square column of 152.4×152.4 mm, obtaining a titania-doped quartz glass ingot II.

As in Example 1, the ingot was measured for a titania concentration difference (Δx), a titania concentration gradient, a minimum of apparent transmittance to 440-nm wavelength light, a birefringence, maximum and minimum of CTE between 10° C. and 30° C., an OH group concentration distribution (a difference between maximum and minimum OH group concentrations), a hydrogen molecule concentration, and a Si—H bond content as well as a surface roughness, a PV flatness in the square central region of 142.4×142.4 mm within the substrate surface, and a PV flatness in every area of 1 mm² in the square central region. The results are also shown in Table 1.

As seen from the results of Comparative Example 1, a photomask substrate produced from a titania-doped quartz glass having a substantial titania concentration gradient has an increased PV flatness after polishing. It also has a low apparent transmittance at 440 nm and values of CTE between 10° C. and 30° C. outside the range of −30 to +30 ppb/° C.

TABLE 1

|  |  | Example 1 | Comparative Example 1 |
|---|---|---|---|
| Titania concentration (wt %) | Max | 7.4 | 7.4 |
|  | Min | 7.3 | 7.3 |
| Titania concentration gradient (wt %/μm) |  | 0.001 | 0.021 |
| Apparent transmittance (%) | Min | 82.1 | 28.1 |
| Birefringence (nm/cm) |  | 3.8 | 36.8 |
| CTE (ppb/° C.) | Max | 5 | 0 |
|  | Min | −5 | −50 |
| OH concentration distribution (ppm) |  | 32 | 36 |
| Hydrogen molecule concentration (molecules/cm³) |  | $5 \times 10^{17}$ | $1 \times 10^{18}$ |
| Si—H bond content (bonds/cm³) |  | $5 \times 10^{16}$ | $5 \times 10^{16}$ |
| Surface roughness/Rms (nm) |  | 0.15 | 0.15 |
| PV flatness (nm) |  | 23 | 186 |
| PV flatness @ 1 mm² (nm) |  | 0.8 | 24 |

Japanese Patent Application Nos. 2005-354488 and 2006-318172 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for preparing a titania-doped quartz glass, comprising the steps of subjecting a silicon source gas and a titanium source gas to flame hydrolysis with the aid of a combustible gas and a combustion-supporting gas in a furnace, to thereby form synthetic silica fine particles, depositing the silica fine particles on a rotating target, and concurrently melting and vitrifying the deposited silica into titania-doped quartz glass, wherein the target is rotated at a speed of at least 5 rpm, the flow rates of the silicon source gas, the titanium source gas, the combustible gas and the combustion-supporting gas are controlled to a variation within ±1%/hr, and the temperatures of the gases fed into or taken out of the furnace and the ambient atmosphere surrounding the furnace are controlled to a variation within ±2.5° C.

2. The method of claim 1, further comprising the step of annealing the titania-doped quartz glass by holding at 700 to 1300° C. in air for 1 to 200 hours and then slowly cooling at a rate of 1 to 20° C./hr to 500° C.

* * * * *